US009185829B2

(12) United States Patent
Murayama et al.

(10) Patent No.: US 9,185,829 B2

(45) Date of Patent: Nov. 10, 2015

(54) AIR-CONDITIONING SYSTEM AND AIR-CONDITIONING METHOD FOR SERVER ROOM MANAGEMENT

(75) Inventors: Dai Murayama, Tokyo (JP); Yasuo Takagi, Tokyo (JP); Hideyoshi Ootani, Tokyo (JP); Tomoyuki Kinoshita, Tokyo (JP); Yuuichi Hanada, Tokyo (JP); Hiroshi Morimoto, Tokyo (JP); Kobun Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 636 days.

(21) Appl. No.: 13/576,165

(22) PCT Filed: Jun. 15, 2012

(86) PCT No.: PCT/JP2012/065392

§ 371 (c)(1), (2), (4) Date: Jul. 31, 2012

(87) PCT Pub. No.: WO2013/073222

PCT Pub. Date: May 23, 2013

(65) Prior Publication Data

US 2013/0299157 A1 Nov. 14, 2013

(30) Foreign Application Priority Data

Nov. 16, 2011 (JP) ................................. 2011-250837

(51) Int. Cl.

*H05K 7/20* (2006.01)

*F24F 3/14* (2006.01)

(Continued)

(52) U.S. Cl.

CPC .............. *H05K 7/20745* (2013.01); *F24F 3/14* (2013.01); *H05K 7/20836* (2013.01);

(Continued)

(58) Field of Classification Search

CPC ....... G06F 1/20; G06F 1/206; H05K 7/20836; H05K 7/2079; H05K 7/20745

See application file for complete search history.

(56) References Cited

U.S. PATENT DOCUMENTS 4,312,226 A * 1/1982 Adams et al. ................. 374/109

5,564,626 A * 10/1996 Kettler et al. ................ 236/49.3

(Continued)

FOREIGN PATENT DOCUMENTS

JP 49 121345 11/1974

JP 2000 121130 4/2000

(Continued)

OTHER PUBLICATIONS

International Search Report Issued Sep. 18, 2012 in PCT/JP12/65392 Filed Jun. 15, 2012.

*Primary Examiner* — Jonathan Bradford

(74) *Attorney, Agent, or Firm* — Oblon, McClelland, Maier & Neustadt, L.L.P.

(57) ABSTRACT

A system for a server room management includes an air-conditioning control device including: an acquisition unit; a setting unit that sets content for generating supply air at temperature, absolute humidity, and relative humidity within target range, based on outside air temperature and humidity as well as return air temperature; and a controller controlling amount of outside air, amount of return air, control amount of humidifier, control amount of cooler, and amount of air blown by blower, based on the content. If the outside air is within range greater than absolute humidity upper limit, or within range greater than enthalpy upper limit and greater than the temperature upper limit, the setting unit compares outside air and return air, and then determines, in accordance with the comparison, whether to set the content so that the cooler performs cooling by minimizing or maximizing the amount of the outside air.

5 Claims, 7 Drawing Sheets

(51) Int. Cl.
*G06F 1/20* (2006.01)
*F24F 11/00* (2006.01)

(52) U.S. Cl.
CPC ................... *F24F 2011/0002* (2013.01); *F24F 2011/0013* (2013.01); *F24F 2011/0016* (2013.01); *G06F 1/20* (2013.01); *G06F 1/206* (2013.01); *H05K 7/2079* (2013.01)

(56) References Cited

U.S. PATENT DOCUMENTS

| | | | | |
|---|---|---|---|---|
| 6,293,115 | B1 * | 9/2001 | Forrest et al. | 62/186 |
| 6,415,617 | B1 * | 7/2002 | Seem | 62/186 |
| 7,800,900 | B1 * | 9/2010 | Noteboom et al. | 361/679.47 |
| 8,151,578 | B1 * | 4/2012 | Morales et al. | 62/91 |
| 2005/0279110 | A1 * | 12/2005 | Zeng et al. | 62/176.6 |
| 2008/0185446 | A1 * | 8/2008 | Tozer | 236/49.4 |
| 2009/0210096 | A1 * | 8/2009 | Stack et al. | 700/278 |

FOREIGN PATENT DOCUMENTS

| | | |
|---|---|---|
| JP | 2001 272086 | 10/2001 |
| JP | 2005 172309 | 6/2005 |
| JP | 2010 246041 | 10/2010 |
| JP | 2010 261696 | 11/2010 |
| JP | 2011 47581 | 3/2011 |
| JP | 2011 56562 | 3/2011 |
| JP | 2011 242008 | 12/2011 |
| JP | 2011 242010 | 12/2011 |

* cited by examiner

AIR CONDITIONING SYSTEM
AIR CONDITIONING CONTROL DEVICE
RETURN AIR
SUPPLY AIR
241 RETURN AIR
EXHAUST AIR
OUTSIDE AIR
OUTDOOR UNIT
T
R
1
10
11
11a
12-1
12-2
12-3
12-4
13
14
20
21
22
23
24
25
26
27
28
29
30
242
243
244
245
246
247
248

AIR-CONDITIONING SYSTEM AND AIR-CONDITIONING METHOD FOR SERVER ROOM MANAGEMENT

CROSS-REFERENCE TO RELATED APPLICATION

This application is national stage application of International Application No. PCT/JP2012/065392, filed Jun. 15, 2012, which designates the United States, incorporated herein by reference, and which claims the benefit of priority from Japanese Patent Application No. 2011-250837, filed on Nov. 16, 2011, the entire contents of which are incorporated herein by reference.

FIELD

Embodiments described herein relate generally to an air-conditioning system and an air-conditioning method for server room management.

BACKGROUND

Along with the progress of information technology (IT) in various fields in recent years, there has been increasing needs for data centers that provide lines connected to a network and maintenance and management services to customers.

Typically, because a number of servers are placed in a server room of data centers, a large amount of heat is generated therefrom. To operate servers normally in such a server room, it is required to perform air-conditioning on a server room appropriately and to maintain the server room within a predetermined range of environmental conditions.

As a technology for cooling a room in which a number of computers are placed, such as a server room of data centers, there has been developed an air-conditioning system in which air sucked from a lower space of a room is blown out to an upper space, whereby the air is caused to be sucked from an upper part of a server rack.

By using the technology, it is possible to reduce the temperature gradient of the whole server room and the fluctuation in the supply air temperature. Therefore, efficient air-conditioning control can be achieved.

However, if a load of a target to be air-conditioned, such as a server room of a data center, is information devices, there exists characteristics different from that of a typical building. For example, for such target to be air-conditioned, most of the load is a sensible heat load, the preset temperature and humidity only needs to fall within a predetermined range, and no air ventilation for preventing increase in $CO_2$ concentration is required because the load generates no $CO_2$. However, conventionally there is a disadvantage in that no air-conditioning control is performed in accordance with these characteristics, thereby resulting in consumption of unnecessary energy.

DETAILED DESCRIPTION

Figure 1:
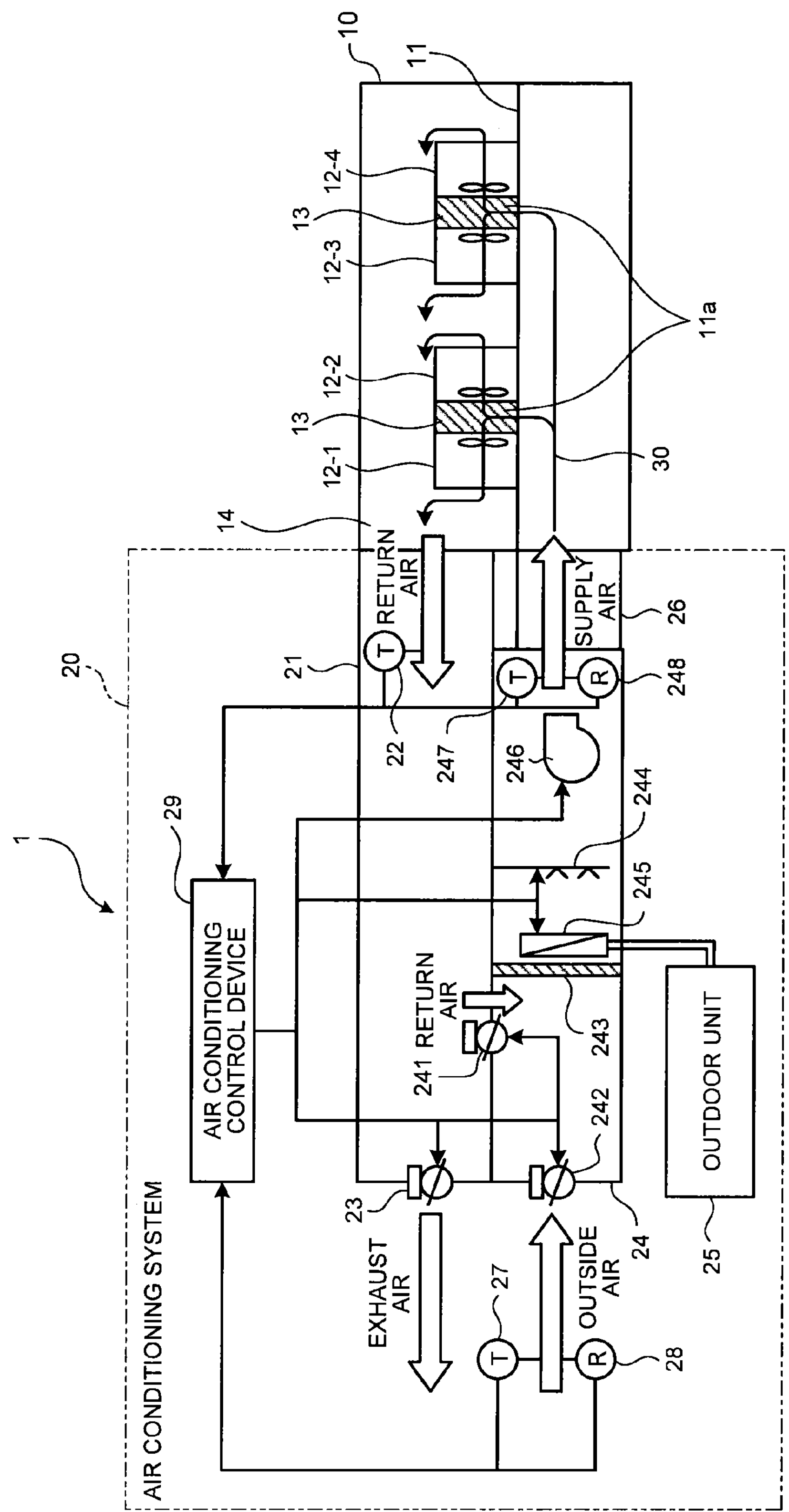
FIG. 1 is an overall diagram illustrating a configuration of an air-conditioning system according to an embodiment.

According to an embodiment, an air-conditioning system for server room management includes a first space and a second space separated from each other. A server is placed between the first space and the second space. Supply air entering into the first space is heated by heat generation of the server and flows out through the second space as return air. The air-conditioning system includes: an outside air introduction device; a return air introduction device; a humidifier; a cooler; a blower; a return air temperature measuring instrument; and an air-conditioning control device. The outside air introduction device adjusts an amount of introduction of outside air, and introduces the outside air. The return air introduction device adjusts an amount of introduction of the return air flowing out from the second space of the server room, and introduces the return air. The humidifier is capable of humidifying at least one of the outside air and the return air. The cooler is capable of cooling at least one of the outside air and the return air. The blower causes the return air and the outside air from the humidifier and the return air and the outside air from the cooler to enter the first space as the supply air, and causes the return air to flow out from the second space. The return air temperature measuring instrument measures return air temperature.

The air-conditioning control device includes: a measured outside air temperature and humidity acquisition unit; an air-conditioning control content setting unit; and a device control unit. The measured outside air temperature and humidity acquisition unit acquires a measured outside air temperature and a measured outside air humidity. The air-conditioning control content setting unit sets an air-conditioning control content for generating supply air at a temperature, an absolute humidity, and a relative humidity within a preliminarily set target range, based on the measured outside air temperature and the measured outside air humidity acquired by the measured outside air temperature and humidity acquisition unit as well as a measured return air temperature acquired from the return air temperature measuring instrument.

The device control unit controls the amount of introduction of the outside air, the amount of introduction of the return air, a control amount of the humidifier, a control amount of the cooler, and an amount of air blown by the blower, based on the air-conditioning control content set by the air-conditioning control content setting unit. If it is determined that an air state of the outside air is within an air state range greater than an upper limit of the target range of the absolute humidity, or if it is determined that the state of the outside air is within an air state range greater than an upper limit of an enthalpy range corresponding to an air state within the target ranges of the temperature and the absolute humidity and greater than the upper limit of the target range of the temperature, the air-conditioning control content setting unit compares the air state of the outside air and an air state of the return air. Then, the air-conditioning control content setting unit determines, in accordance with a result of the comparison, whether to set the air-conditioning control content so that the cooler performs cooling processing by minimizing the amount of introduction of the outside air or whether to set the air-conditioning control content so that the cooler performs cooling processing by maximizing the amount of introduction of the outside air.

<Configuration of a Server Room Management System>

A configuration of a server room management system serving as an air-conditioning system for managing a server room according to an embodiment will be described with reference to FIG. 1.

A server room management system 1 according to the present embodiment includes a server room 10 of a data center or the like, and an air-conditioning system 20 that performs air-conditioning of the server room 10.

The server room 10 is provided with a double floor 11 including a plurality of openings 11*a*. A plurality of server racks 12-1 to 12-4 housing therein a plurality of servers (not illustrated) are placed on the double floor 11. In the server room 10, by operation of fans (blowers) placed in the servers or fans placed in the server racks 12-1 to 12-4, cold air entering into a space below the double floor 11 is sucked into a space above the double floor 11 from the openings 11*a* on the double floor 11 as indicated by an arrow 30 in FIG. 1. With this configuration, the air is heated by heat generation of the servers, whereby airflow is generated such that the air flows out as return air. The generation of airflow forms a cold area 13 serving as a first space containing the cold air sucked into the server racks 12-1 to 12-4 and a hot area 14 serving as a second space containing warm air flowing out from the server racks 12-1 to 12-4 above the double floor 11. Because the generated heat is cooled by the cold air in this manner, the servers can operate normally.

The air-conditioning system 20 includes: a return air duct 21; a return air temperature sensor 22 serving as a return air temperature measuring instrument; an exhaust air damper 23; an indoor unit 24; an outdoor unit 25; a supply air duct 26; an outside air temperature sensor 27; an outside air humidity sensor 28; and an air-conditioning control device 29.

The return air duct 21 is a duct through which air passes, and connects the hot area 14 of the server room 10 and the indoor unit 24 of the air-conditioning system 20.

The return air temperature sensor 22 measures the temperature of return air entering from the hot area 14, and sends the measured value to the air-conditioning control device 29.

The exhaust air damper 23 adjusts the amount of return air exhausted to the outside from the return air duct 21 by the degree of opening thereof.

The indoor unit 24 includes: a return air introduction damper 241 serving as a return air introduction device; an outside air introduction damper 242 serving as an outside air introduction device; a filter 243; a humidifier 244, a cooling coil (cooler) 245, and an air supply fan (blower) 246 serving as cold air generation devices; a supply air temperature sensor 247 serving as a supply air temperature measuring instrument; and a supply air humidity sensor 248.

The return air introduction damper 241 adjusts the amount of return air introduced into the indoor unit 24 from the return air duct 21 by the degree of opening thereof.

The outside air introduction damper 242 adjusts the amount of outside air introduced into the indoor unit 24 by the degree of opening thereof.

The filter 243 removes dust from outside air introduced when the outside air introduction damper 242 is opened and from return air introduced from the return air duct 21 when the return air introduction damper 241 is opened.

The humidifier 244 humidifies the outside air and the return air from which dust is removed by the filter 243 as needed.

The cooling coil 245 cools the outside air and the return air from which dust is removed by the filter 243 as needed, to generate cold air.

The air supply fan 246 blows cold air generated by the humidification performed by the humidifier 244 as needed and the cooling performed by the cooling coil 245 as needed, and causes the cold air to enter the cold area 13 through the supply air duct 26 and the space below the floor of the server room 10. By controlling the rotation speed of the air supply fan 246, the amount of blown air is controlled.

The supply air temperature sensor 247 measures the temperature of supply air to be introduced into the server room 10, and sends the measured value to the air-conditioning control device 29.

The supply air humidity sensor 248 measures the humidity of supply air to be introduced into the server room 10, and sends the measured value to the air-conditioning control device 29.

The outdoor unit 25 is connected to the cooling coil 245, and supplies the cooling coil 245 with a refrigerant used when the cooling coil 245 generates the cold air.

The supply air duct 26 is a duct through which air passes, and connects the indoor unit 24 to the space below the floor of the server room 10 communicated with the cold area 13.

The outside air temperature sensor 27 measures the temperature of the outside air, and sends the measured value to the air-conditioning control device 29. The outside air humidity sensor 28 measures the humidity of the outside air, and sends the measured value to the air-conditioning control device 29.

Figure 2:
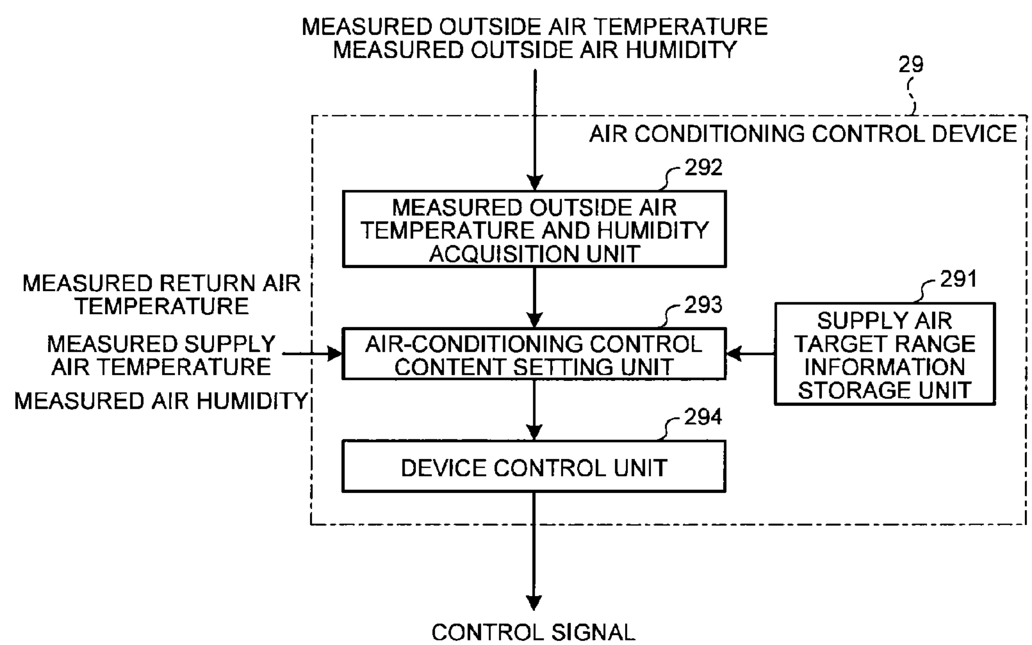
FIG. 2 is a block diagram illustrating a configuration of an air-conditioning control device of the air-conditioning system of the embodiment.

As illustrated in FIG. 2, the air-conditioning control device 29 includes a supply air target range information storage unit 291, a measured outside air temperature and humidity acquisition unit 292, an air-conditioning control content setting unit 293, and a device control unit 294.

The supply air target range information storage unit 291 stores therein a supply air temperature target range and a supply air humidity target range for the server room 10.

The measured outside air temperature and humidity acquisition unit 292 acquires a measured outside air temperature measured by the outside air temperature sensor 27 and a measured outside air humidity measured by the outside air humidity sensor 28.

The air-conditioning control content setting unit 293 acquires the measured outside air temperature and the measured outside air humidity acquired from the measured outside air temperature and humidity acquisition unit 292, the measured return air temperature measured by the return air temperature sensor 22, the measured supply air temperature measured by the supply air temperature sensor 247, and the measured supply air humidity measured by the supply air humidity sensor 248. Based on these measured values and on the supply air temperature target range and the supply air humidity target range stored in the supply air target range information storage unit 291, the air-conditioning control content setting unit 293 sets air-conditioning control contents for generating supply air within a temperature range and a humidity range set in advance (which will be described later in detail).

The device control unit 294 controls an operation of each device in the air-conditioning system 20 based on the air-conditioning control contents set by the air-conditioning control content setting unit 293.

<Operation of the Server Room Management System>

An operation of the server room management system 1 according to the present embodiment will now be described.

In the present embodiment, the supply air target range information storage unit 291 of the air-conditioning control device 29 in the server room management system 1 preliminarily stores therein the supply air temperature target range and the supply air humidity target range for the server room 10.

In the present embodiment, range information of a range set in accordance with specifications of the American Society of Heating, Refrigerating and Air-conditioning Engineers (ASHRAE), is stored as the supply air temperature target range and the supply air humidity target range for the server room 10. Here, the ranges between 18 and 35° C., the absolute humidity ranges between 0.0056 and 0.0107 kg/kg, and the relative humidity is equal to or lower than 60%.

An explanation will be made of an operation performed when the air-conditioning control device 29 controls each device with the supply air temperature target range and the supply air humidity target range stored in the supply air target range information storage unit 291 as described above.

The air-conditioning control content setting unit 293 acquires the measured outside air temperature and the measured outside air humidity acquired by the measured outside air temperature and humidity acquisition unit 292.

Next, based on the supply air temperature target range and the supply air humidity target range stored in the supply air target range information storage unit 291, the air-conditioning control content setting unit 293 sets air-conditioning control contents for generating the supply air within the supply air temperature target range and the supply air humidity target range set in advance. The setting processing of the air-conditioning control contents performed by the air-conditioning control content setting unit 293 will now be described in detail.

Figure 3:
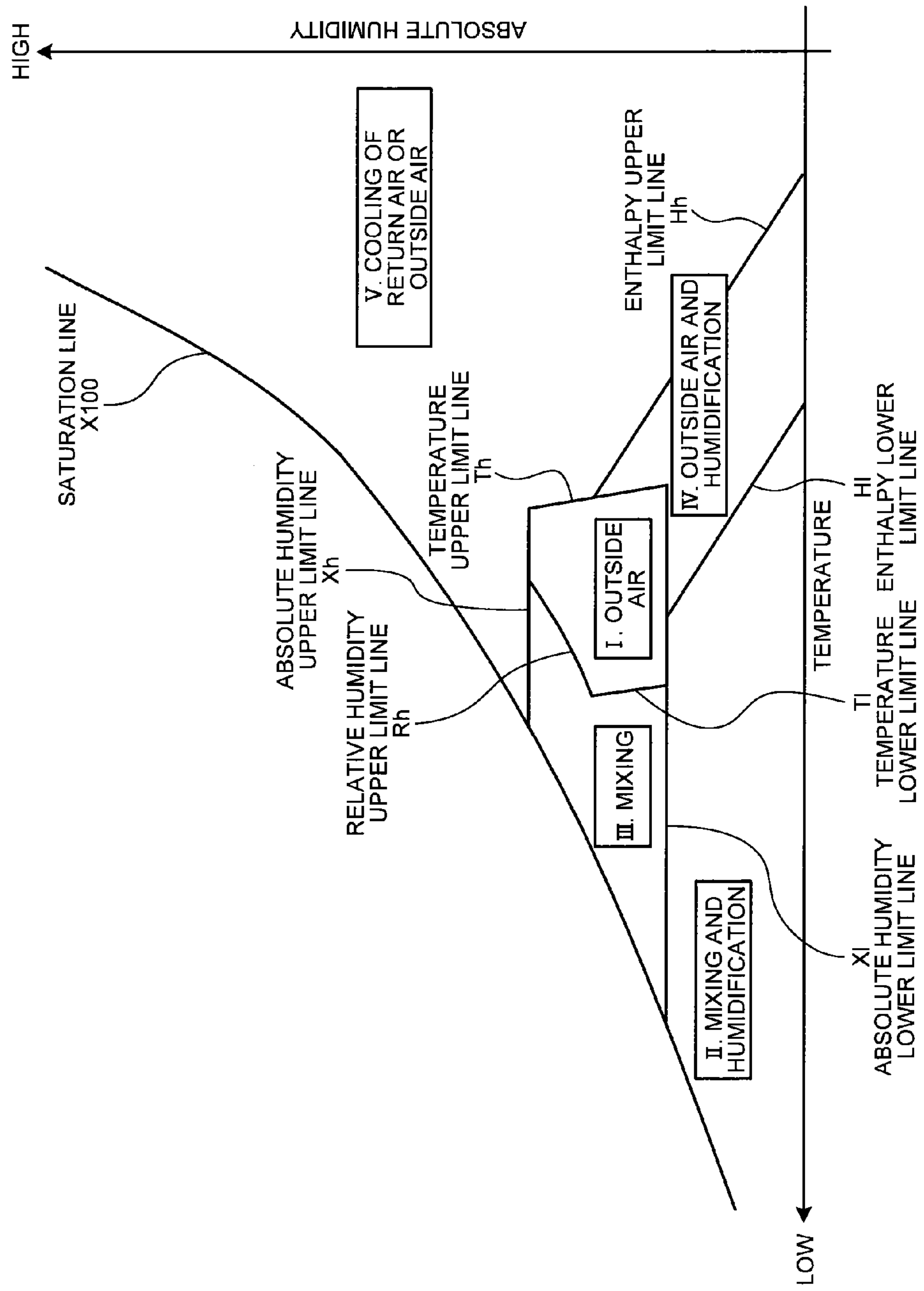
FIG. 3 is a graph illustrating ranges of air states of outside air classified by the air-conditioning control device of the air-conditioning system of the embodiment on a psychrometric diagram.

Based on the measured outside air temperature and the measured outside air humidity thus acquired, it is determined to which area on a psychrometric diagram partitioned as illustrated in FIG. 3 the state of present outside air corresponds. The psychrometric diagram is a diagram illustrating a state of humid air by using a temperature, an absolute/relative humidity, and an enthalpy on the diagram.

In the psychrometric diagram of FIG. 3, the state of air with relative humidity of equal to or lower than 100% (saturated state) represented by a saturation line ×100 is partitioned into areas I to V indicating five ranges of air state mentioned below. Here, the state of air is partitioned based on: a value indicated by the supply air temperature target range (range indicated by the line Tl of the lower limit temperature and the line Th of the upper limit temperature in FIG. 3) and the supply air humidity target range (range indicated by the line Xl of the lower limit absolute humidity and the line Xh of the upper limit absolute humidity in FIG. 3) described above; an upper limit enthalpy indicated by the line Hh of the upper limit enthalpy and a lower limit enthalpy indicated by the line Hl of the lower limit enthalpy corresponding to the state of air in the range within the supply air temperature target range and the supply air humidity target range; and an upper limit relative humidity indicated by the line Rh of the upper limit relative humidity. In the present embodiment, the upper limit enthalpy corresponding to the supply air temperature target range and the supply air humidity target range described above is 50 kJ/kg (DA), and the lower limit enthalpy corresponding to the ranges is 35 kJ/kg (DA).

Region I (First Range of Air State):

Region I is within the supply air temperature target range, the supply air absolute humidity range, which is a target, and within the supply air relative humidity range. That is to say, the region I is within a range satisfying following Equation (1) on the psychrometric diagram.

$$\text{(Temperature of equal to or higher than 18° C. and equal to or lower than 35° C.)} \cap \text{(Absolute Humidity of equal to or higher than 0.0056 kg/kg (DA) and equal to or lower than 0.0107 kg/kg (DA))} \cap \text{(Relative Humidity of equal to or lower than 60\%)} \quad (1)$$

Region II (Second Range of Air State):

Region II is within a range lower than the lower limit of the supply air absolute humidity range, which is a target, and within a range lower than the lower limit enthalpy in a target range. That is to say, the region II is within a range satisfying following Equation (2) on the psychrometric diagram.

$$\text{(Absolute Humidity of lower than 0.0056 kg/kg(DA))} \cap \text{(Specific Enthalpy of lower than 35 kJ/kg(DA))} \quad (2)$$

Region III (Third Range of Air State):

Region III is within a range of the supply air absolute humidity, which is a target, and within a range lower than the lower limit of the supply air temperature range, which is a target, and further within a range greater than or equal to an upper limit of the supply air relative humidity, which is a target. That is to say, the region III is within a range satisfying Equation (3) on the psychrometric diagram.

$$\text{(Absolute Humidity of equal to or higher than 0.0056 kg/kg(DA) and equal to or lower than 0.0107 kg/kg(DA))} \cap \{\text{(Temperature of lower than 18° C.)} \cup \text{(Relative Humidity of equal to or higher than 60\%)}\} \quad (3)$$

Region IV (Fourth Range of Air State):

Region IV is within an enthalpy range corresponding to the ranges of the supply air temperature and humidity, which are the target, and within a range lower than the lower limit of the supply air absolute humidity range, which is a target, or a range greater than the upper limit of the supply air temperature range, which is the target. That is to say, the Region IV is within a range satisfying following Equation (4) on the psychrometric diagram.

$$\text{(Specific Enthalpy of equal to or higher than 35 kJ/kg(DA) and equal to or lower than 50 kJ/kg (DA))} \cap \{\text{(Absolute Humidity of lower than 0.0056 kg/kg(DA))} \cup \text{(Temperature of higher than 35° C.)}\} \quad (4)$$

Region V (Fifth Range of Air State):

Region V is a range other than the ranges I to IV. In particular, as illustrated in FIG. 3, the region V is a range of air state within a range greater than the upper limit of the supply air humidity target region, or within a range greater than the upper limit of the enthalpy range, which corresponds to the air state within the ranges of the supply air temperature target range and the supply air humidity target range, as well as within a range greater than the upper limit of the supply air temperature target region.

When it is determined to which of the regions I to V the present state of outside air corresponds, the air-conditioning control content setting unit 293 uses the measured outside air temperature and the measured outside air humidity acquired by the measured outside air temperature and humidity acquisition unit 292, the measured return air temperature measured by the return air temperature sensor 22, the measured supply air temperature measured by the supply air temperature sensor 247, and the measured supply air humidity measured by the supply air humidity sensor 248, and sets air-conditioning control contents for each regions, as will be described below. The target on which the air-conditioning control is performed is a sensible heat load caused by heat generated from the servers in the server room 10. An assumption is made that no latent heat load caused by expiration of a person and the like is generated and that the return air humidity value is identical to the supply air humidity measured value measured by the supply air humidity sensor 248.

Air-conditioning Control Contents in Case of Corresponding to Region I:

If the present state of outside air falls within the region I, the outside air can be used as the supply air without any change. Therefore, the control contents are determined such that the outside air introduction ratio reaches 100%, by fully opening the exhaust air damper 23, closing the return air introduction damper 241, and fully opening the outside air introduction damper 242. At this time, the humidifier 244 performs no humidification processing or the cooling coil 245 performs no cooling processing on mixed air.

Air-conditioning Control Contents in Case of Corresponding to Region II:

If the present state of outside air falls within the Region II, the control contents are determined such that the outside air is heated and humidified by mixing the return air with the outside air. In particular, the control contents are determined such that the degrees of opening of the exhaust air damper 23, the return air introduction damper 241, and the outside air introduction damper 242 are adjusted between 0% and 100% in accordance with the outside air introduction ratio, and that humidification of a required amount is performed by the humidifier 244.

At this time, a target outside air introduction ratio $\alpha$ is adjusted by the measured outside air temperature and the measured return air temperature so that the air thus mixed reaches the target supply air temperature set in advance within the supply air temperature target range and the supply air humidity target range stored in the supply air target range information storage unit 291.

An absolute humidity X of the air obtained by adjusting the outside air introduction ratio and mixing the return air with the outside air in this manner is expressed by Equation (5) where a measured outside air absolute humidity is Xo, a measured return air absolute humidity is Xr, and the target outside air introduction ratio is $\alpha$.

$$X = Xo \times \alpha + Xr \times (1-\alpha) \quad (5)$$

To change the air thus mixed into supply air in the target temperature and humidity condition, it is required to perform humidification by Xs0−X, which is a difference between the absolute humidity X of the air thus mixed and the target supply air absolute humidity Xs0. A required amount of humidification for increasing the humidity by the difference is calculated by Fs×(Xs0−X) where Fs represents a flow amount of air supply. Thus, control contents of a valve (not illustrated) for controlling an amount of water of the humidifier 244 are determined such that the required amount of humidification is supplied. At this time, the cooling coil 245 performs no cooling processing on the air thus mixed.

To perform humidification after mixing the outside air and the return air, the required amount of humidification is determined as described above. The humidification after the mixing can be omitted by humidifying the return air in advance so as to reach a target absolute humidity {Xr+(X−Xs0)/(1−$\alpha$)}.

In this case, the target value $\alpha$ of the outside air introduction ratio is expressed by following Equation (6) where a measured outside air temperature is To, a return air temperature after humidification is Tr2, and a target supply air temperature is Ts0.

$$\alpha = (Tr2 - Ts0)/(Tr2 - To) \times 100(\%) \quad (6)$$

Air-conditioning Control Contents in Case of Corresponding to Region III:

If the present state of outside air falls within the region III, the control contents are determined so that the outside air is heated by mixing the return air with the outside air. In particular, the control contents are determined so that the degrees of opening of the exhaust air damper 23, the return air introduction damper 241, and the outside air introduction damper 242 are adjusted between 0% and 100% in accordance with the outside air introduction rate.

In this case, the target outside air introduction ratio $\alpha$ is expressed by following Equation (7) where the measured outside air temperature is To, a measured return air temperature is Tr, and the target supply air temperature is Ts0.

$$\alpha = (Tr - Ts0)/(Tr - To) \times 100(\%) \quad (7)$$

At this time, the humidifier 244 performs no humidification processing, and the cooling coil 245 performs no cooling processing on the air thus mixed.

Air-conditioning Control Contents in Case of Corresponding to Region IV:

If the present state of outside air falls within the region IV, the control contents are determined so that humidification is performed on the outside air. In particular, the control contents are determined so that the outside air introduction rate reaches 100% and that the humidifier 244 performs humidification of a required amount by fully opening the exhaust air damper 23, closing the return air introduction damper 241, and fully opening the outside air introduction damper 242.

In this case, the required amount of humidification is calculated by Xs0−Xo where the measured outside air absolute humidity is Xo and the target supply air humidity is Xs0. At this time, the outside air temperature decreases from To to T along with the humidification. If the target supply air temperature Ts0 is lower than T, the cooling coil 245 is controlled to perform cooling processing such that the outside air temperature reaches the target supply air temperature.

Air-conditioning Control Contents in Case Corresponding to Region V:

If the present state of the outside air falls within the region V, whether to cool the return air or the outside air to be introduced as the supply air is determined, and one of the operations is performed.

When the return air is cooled, the control contents are determined so that the outside air introduction ratio reaches 0% and that the cooling coil 245 performs cooling processing, by closing the exhaust air damper 23, fully opening the return air introduction damper 241, and closing the outside air introduction damper 242. At this time, the humidifier 244 performs no humidification processing. In the determination of the control contents, the control contents may be determined so that the cooling coil 245 performs dehumidification processing in addition to the cooling processing.

When the outside air is cooled, the control contents are determined so that the outside air introduction ratio reaches 100% and that the cooling coil 245 performs cooling processing, by opening the exhaust air damper 23, closing the return air introduction damper 241, and opening the outside air introduction damper 242. At this time, the humidifier 244 performs no humidification processing. In the determination of the control contents, the control contents may be determined such that the cooling coil 245 performs dehumidification processing in addition to the cooling processing.

A particular method for determining whether to cool the return air as the supply air or whether to cool the outside air as the supply air will now be described. The actual operation thereof is performed by the air-conditioning control content setting unit 293. While three methods are explained in the description below, any one of them may be employed.

Figure 4:
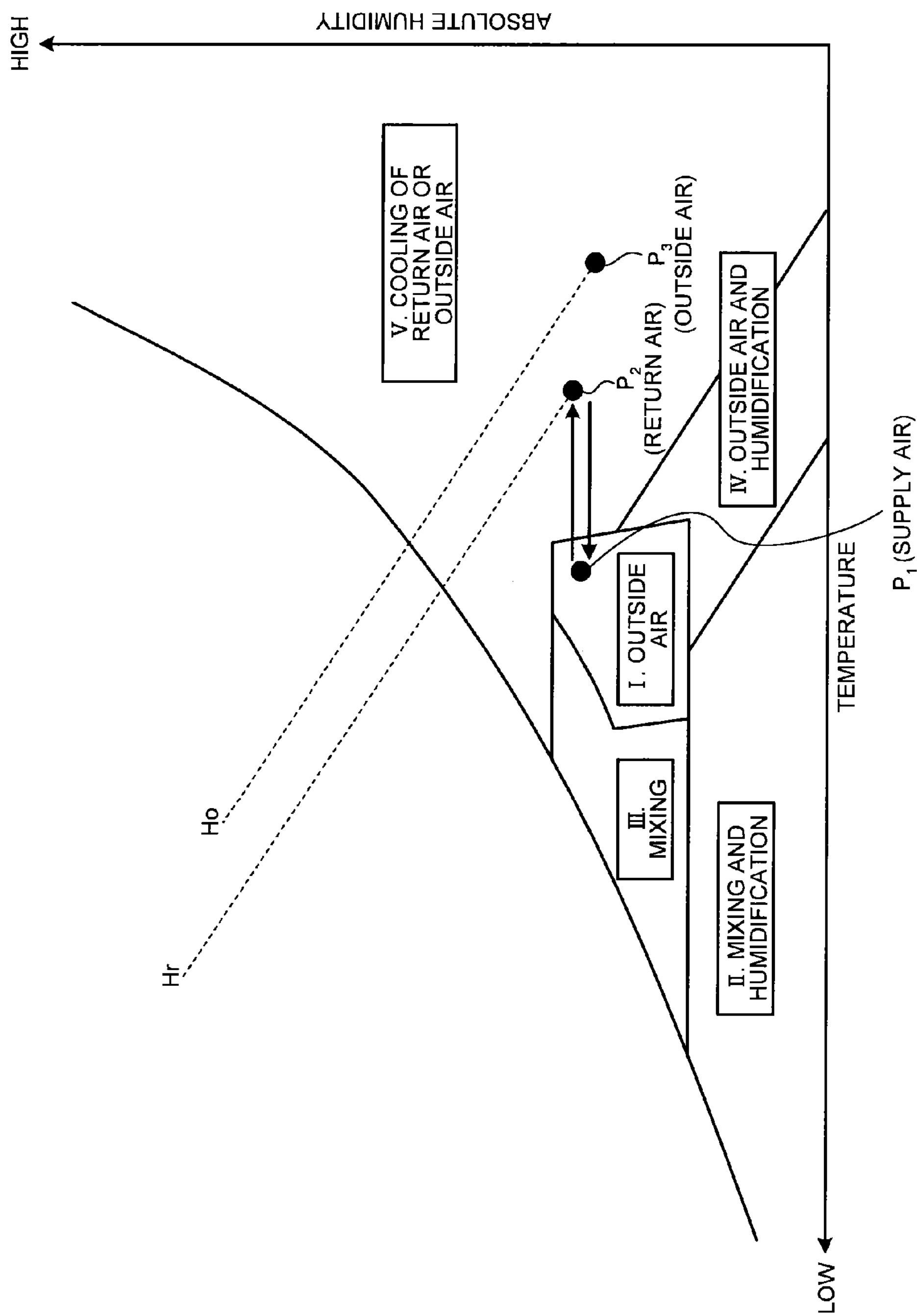
FIG. 4 is a graph illustrating comparison between an enthalpy of outside air and an enthalpy of return air in the air-conditioning control device of the embodiment, on a psychrometric diagram.

First Method:

In FIG. 4, if an enthalpy of the return air (return air enthalpy) Hr is compared with an enthalpy of the outside air (outside air enthalpy) Ho, it is to be understood that Ho>Hr is satisfied. In this case, by cooling the return air having lower enthalpy and using the return air as the supply air, it is possible to perform air-conditioning control with a greater energy-saving effect. If Ho<Hr is satisfied, the outside air is cooled and used as the supply air. Furthermore, in the case where the enthalpy of the outside air is identical to that of the return air (that is, Ho=Hr), if the outside air has been cooled and used as the supply air, the operation is continued. By contrast, if the return air has been cooled to be used as the supply air, the operation is continued.

Figure 5:
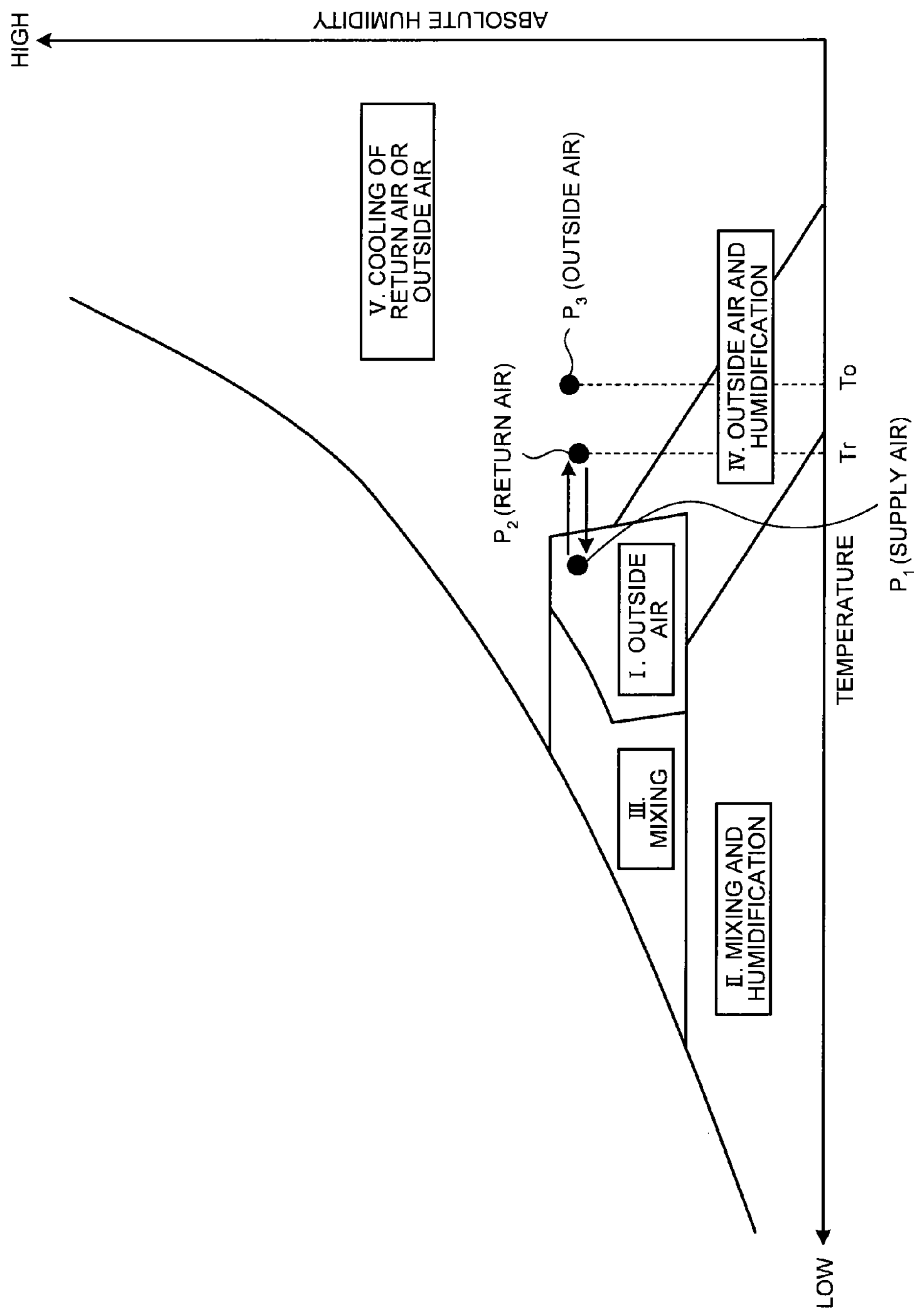
FIG. 5 is a graph illustrating comparison between a temperature of the outside air and a temperature of the return air in the air-conditioning control device of the embodiment, on a psychrometric diagram.

Second Method:

In FIG. 5, if the measured return air temperature Tr is compared with the measured outside air temperature To, it is to be understood that To>Tr is satisfied. In this case, by cooling the return air having lower temperature and using the return air as the supply air, it is possible to perform air-conditioning control with a greater energy-saving effect. If To<Tr is satisfied, the outside air is cooled and used as the supply air. Furthermore, in the case where the temperature of the outside air is identical to that of the return air (that is, To=Tr), if the outside air has been cooled and used as the supply air, the operation is continued. By contrast, if the return air has been cooled and used as the supply air, the operation is continued.

Third Method:

In the third method explained with reference to FIG. 6 and FIG. 7, one of cooling of the return air and cooling of the outside air is selected so that power consumption of the outdoor unit 25 corresponding to energy consumed for cooling the return air or the outside air is made lower. With this method, air-conditioning with a greater energy-saving effect can be achieved. The method will be described specifically with reference to FIG. 6 and FIG. 7.

Figure 6:
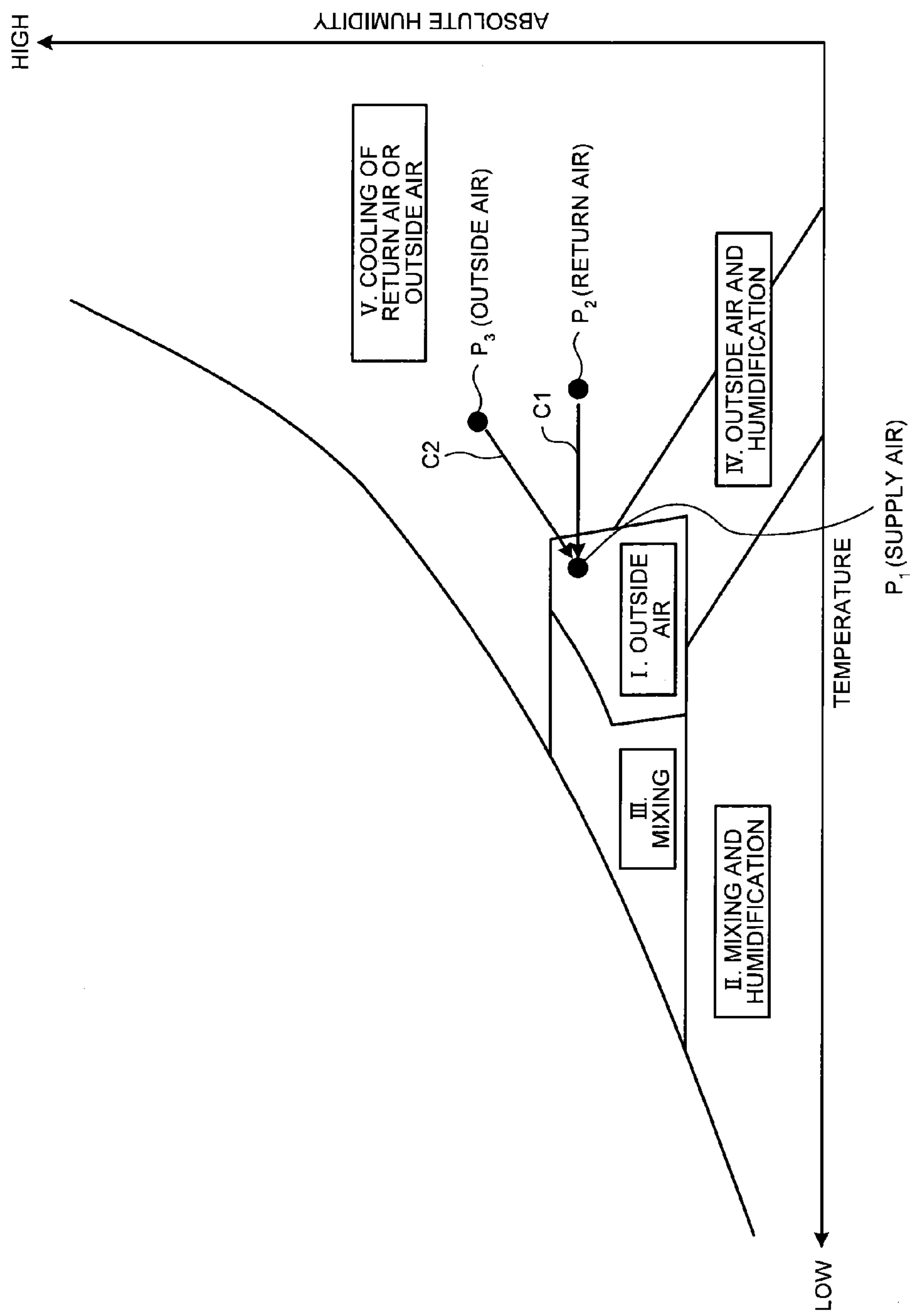
FIG. 6 is a graph illustrating selection of a case in which, when the outside air or the return air is cooled, energy required for the cooling decreases in the air-conditioning control device according to the embodiment, on a psychrometric diagram.

FIG. 6 illustrates consideration of whether to cool the return air or the outside air to obtain the supply air on a psychrometric diagram as indicated by C1 and C2. In FIG. 7, the X-Y axis represents the entrance temperature and humidity of the cooling coil 245, and the Z axis represents the power consumption of the outdoor unit 25. FIG. 7 illustrates power consumption characteristics of the outdoor unit 25. In FIG. 7, in view of cooling of the return air or the outside air, the entrance temperature and the entrance humidity of the cooling coil 245 correspond to the temperature and the humidity of the return air or the outside air, respectively.

If power consumption Po of when the outside air is cooled is compared with power consumption Pr of when the return air is cooled with respect to the measured outside air temperature To, the measured outside air humidity Xo, the measured return air temperature Tr, and the measured return air humidity Xr, it can be understood that Po<Pr is satisfied. In this case, by cooling the outside air and using the outside air as the supply air, it is possible to provide air-conditioning control with a greater energy-saving effect. If Po>Pr is satisfied, the return air is cooled and used as the supply air. Furthermore, in the case where the power consumption of the outdoor unit 25 for the outside air is identical to that for the return air (that is, Po=Pr), if the outside air has been cooled and used as the supply air, the operation is continued. By contrast, if the return air has been cooled and used as the supply air, the operation is continued.

Figure 7:
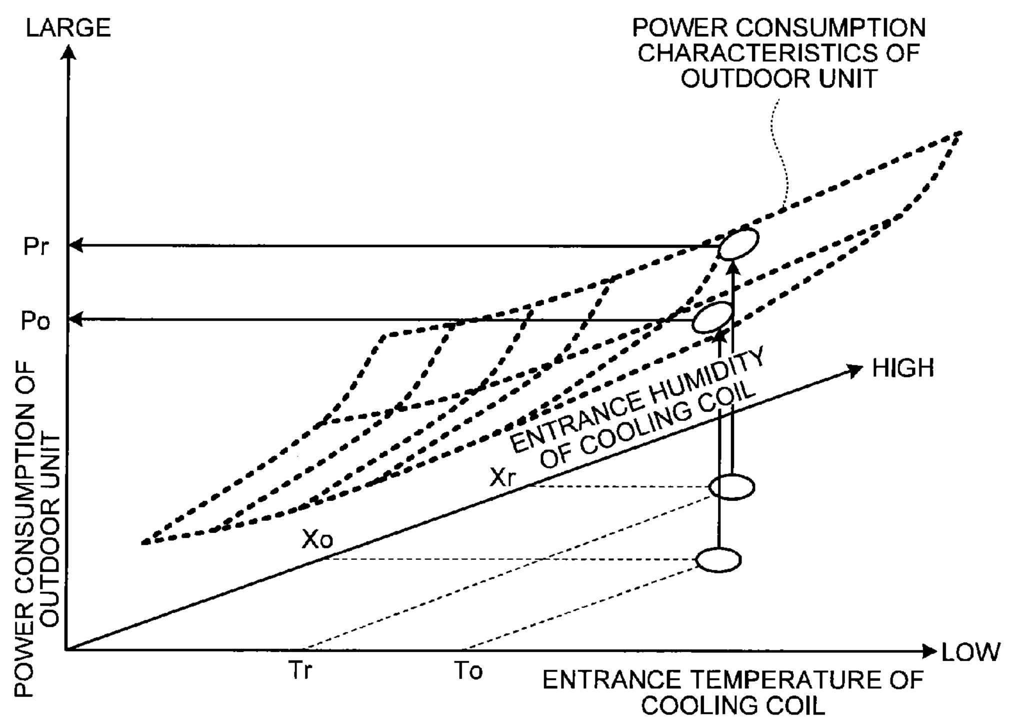
FIG. 7 is a graph illustrating comparison of power consumption of an outdoor unit to select a case in which, when the outside air or the return air is cooled, energy required for the cooling further decreases in the air-conditioning control device according to the embodiment on a psychrometric diagram.

If the power consumption characteristics of the outdoor unit 25 differ depending on the air volume and the temperature of the supply air from the air supply fan 246, the characteristic graph exemplified in FIG. 7 may be changed based on the supply air volume and the supply air temperature in addition to on the entrance temperature and humidity of the cooling coil 245.

If the air-conditioning control content setting unit 293 sets the air-conditioning control contents by the processing described above, the device control unit 294 generates control signals for controlling the degrees of opening of the exhaust air damper 23, the return air introduction damper 241, and the outside air introduction damper 242, the control amounts for the humidifier 244 and the cooling coil 245, and the rotation speed of the air supply fan 246 based on the contents. The device control unit 294 then sends the control signals to the devices, thereby performing control. As a result, supply air having a supply air temperature value and a supply air humidity value within the range to be a target is generated.

As described above, according to the present embodiment, by switching the air-conditioning control contents in accordance with the condition of the outside air to use the outside air as much as possible, and by performing control suitable for server management, it is possible to perform air-conditioning control for server management with a great energy-saving effect.

Furthermore, by using the outside air as much as possible to perform air-conditioning control, it is possible to reduce costs required for operating the server room management system.

In the embodiment, the values determined with reference to the ASHRAE are used as the supply air temperature target range and the supply air humidity target range. However, they are not limited thereto, and other values may be used in accordance with the condition of the target to be controlled, for example. Furthermore, a part or the whole of each of the areas partitioned as illustrated in FIG. 3 may overlap with other areas.

While the embodiment according to the present invention has been described, the embodiment has been presented by way of example only, and is not intended to limit the scope of the invention. Indeed, the novel system and method described herein may be embodied in a variety of other forms; furthermore, various omissions, substitutions, and changes in the form of the system and method described herein may be made without departing from the spirit of the invention. The accompanying claims and their equivalents are intended to cover the embodiment and the modifications as would fall within the scope and spirit of the invention.

The invention claimed is:

1. An air-conditioning system for server room management including a first space and a second space separated from each other, a server being placed between the first space and the second space, supply air entering into the first space being heated by heat generation of the server and flowing out through the second space as return air, the air-conditioning system comprising:

an outside air introduction device that adjusts an amount of introduction of outside air, and introduces the outside air;

a return air introduction device that adjusts an amount of introduction of the return air flowing out from the second space of the server room, and introduces the return air;

a humidifier to humidify at least one of the outside air and the return air;

a cooler to cool at least one of the outside air and the return air;

a blower that causes the return air and the outside air from the humidifier and the return air and the outside air from the cooler to enter the first space as the supply air, and causes the return air to flow out from the second space;

a return air temperature measuring instrument that measures return air temperature; and an air-conditioning control device including:

a measured outside air temperature and humidity acquisition unit that acquires a measured outside air temperature and a measured outside air humidity;

an air-conditioning control content setting unit that sets an air-conditioning control content for generating supply air at a temperature, an absolute humidity, and a relative humidity within a preliminarily set target range, based on the measured outside air temperature and the measured outside air humidity acquired by the measured outside air temperature and humidity acquisition unit as well as a measured return air temperature acquired from the return air temperature measuring instrument; and a device control unit that controls the amount of introduction of the outside air, the amount of introduction of the return air, a control amount of the humidifier, a control amount of the cooler, and an amount of air blown by the blower, based on the air-conditioning control content set by the air-conditioning control content setting unit, wherein, when it is determined that an air state of the outside air is within an air state range greater than an upper limit of an enthalpy range corresponding to an air state within the target ranges of the temperature and the absolute humidity and greater than the upper limit of the target range of the temperature, the air-conditioning control content setting unit compares the air state of the outside air and an air state of the return air, and the air-conditioning control content setting unit determines, in accordance with a result of the comparison, whether to set the air-conditioning control content so that the cooler performs cooling processing by minimizing the amount of introduction of the outside air or whether to set the air-conditioning control content so that the cooler performs cooling processing by maximizing the amount of introduction of the outside air.

2. The air-conditioning system for server room management of claim 1, wherein, when it is determined that the air state of the outside air is within the air state range, the air-conditioning control content setting unit compares an enthalpy of the outside air and an enthalpy of the return air with each other, wherein, as a result of the comparison, when it is determined that the enthalpy of the return air is smaller than the enthalpy of the outside air, the air-conditioning control content setting unit sets the air-conditioning control content so that the cooler performs cooling processing by minimizing the amount of introduction of the outside air, and wherein, as a result of the comparison, when it is determined that the enthalpy of the outside air is smaller than the enthalpy of the return air, the air-conditioning control content setting unit sets the air-conditioning control content so that the cooler performs the cooling processing by maximizing the amount of introduction of the outside air.

3. The air-conditioning system for server room management of claim 1, wherein, when it is determined that the air state of the outside air is within the air state range, the air-conditioning control content setting unit compares an temperature of the outside air and a temperature of the return air with each other, wherein, as a result of the comparison, when it is determined that the temperature of the return air is lower than the temperature of the outside air, the air-conditioning control content setting unit sets the air-conditioning control content so that the cooler performs cooling processing by minimizing the amount of introduction of the outside air, and wherein, as a result of the comparison, when it is determined that the temperature of the outside air is lower than the temperature of the return air, the air-conditioning control content setting unit sets the air-conditioning control content so that the cooler performs cooling processing by maximizing the amount of introduction of the outside air.

4. The air-conditioning system for server room management of claim 1, wherein, when it is determined that the air state of the outside air is within the air state range, the air-conditioning control content setting unit compares energy required for cooling the outside air and energy required for cooling the return air, the energies being for generating the supply air at the temperature, the absolute humidity, and the relative humidity within the preliminarily set target range and being consumed by the cooler, wherein, as a result of the comparison, when it is determined that the energy required for cooling the return air is smaller than the energy required for cooling the outside air, the air-conditioning control content setting unit sets the air-conditioning control content so that the cooler performs cooling processing by minimizing the amount of introduction of the outside air, and wherein, as a result of the comparison, when it is determined that the energy required for cooling the outside air is smaller than the energy required for cooling the return air, the air-conditioning control content setting unit sets the air-conditioning control content so that the cooler performs cooling processing by maximizing the amount of introduction of the outside air.

5. An air-conditioning control method for server room management, wherein an air-conditioning control device of an air-conditioning system for server room management in which a return air introduction device and a supply air introduction device are connected to a server room including a first space and a second space separated from each other, in which a server is placed between the first space and the second space, and in which supply air entering into the first space is heated by heat generation of the server and flows out through the second space as return air, performs:

acquiring, by an outside air and humidity acquisition unit of the air-conditioning control device, a measured outside temperature and a measured outside humidity;

acquiring, by an air-conditioning control content setting unit of the air-conditioning control device, a measured return air temperature from a return air temperature measuring instrument;

comparing, by the air-conditioning control content setting unit of the air-conditioning control device, when it is determined that an air state of the outside air is within an air state range greater than an upper limit of an enthalpy range corresponding to an air state within the target ranges of the temperature and the absolute humidity and greater than the upper limit of the target range of the temperature, the air state of the outside air and an air state of the return air;

determining, by the air-conditioning control content setting unit of the air-conditioning control device, in accordance with a result of the comparing, whether to set the air-conditioning control content so that the cooler performs cooling processing by minimizing the amount of introduction of the outside air or whether to set the air-conditioning control content so that the cooler performs cooling processing by maximizing the amount of introduction of the outside air;

setting, upon determination of the determining, the air-conditioning control content; and controlling, by a device control unit of the air-conditioning control device, an amount of introduction of the outside air, an amount of introduction of the return air, a control amount of the humidifier, a control amount of the cooler, and an amount of air blown by the blower, based on the set air-conditioning control content.

* * * * *